(12) United States Patent
Khosla et al.

(10) Patent No.: US 6,319,842 B1
(45) Date of Patent: Nov. 20, 2001

(54) METHOD OF CLEANSING VIAS IN SEMICONDUCTOR WAFER HAVING METAL CONDUCTIVE LAYER

(75) Inventors: Mukul Khosla, San Jose; Lap Tam, Fremont; Ronald A. Powell, San Carlos; Ronald D. Allen, Union City; Robert T. Rozbicki; Erich Klawuhn, both of San Jose; E. Derryck Settles, Sunnyvale, all of CA (US)

(73) Assignee: Novellus Systems Incorporated, San Jose, CA (US)

( * ) Notice: Subject to any disclaimer, the term of this patent is extended or adjusted under 35 U.S.C. 154(b) by 0 days.

(21) Appl. No.: 09/753,432

(22) Filed: Jan. 2, 2001

(51) Int. Cl.$^7$ .................... H01L 21/302; H01L 21/461
(52) U.S. Cl. .................. 438/714; 438/710; 438/720; 438/722; 438/725; 438/906; 134/1; 134/1.1; 134/1.2; 134/1.3
(58) Field of Search .................... 438/710, 714, 438/720, 722, 725, 906; 134/1, 1.1, 1.2, 1.3

(56) References Cited

U.S. PATENT DOCUMENTS 4,357,203 * 11/1982 Zelez ........................... 156/643
5,432,073 * 7/1995 Wu et al. ...................... 437/195
5,660,682 * 8/1997 Zhao et al. .................... 438/715

* cited by examiner

Primary Examiner—John F. Niebling
Assistant Examiner—David A Zarneke
(74) Attorney, Agent, or Firm—Skjerven, Morrill, MacPherson LLP; David E. Steuber

(57) ABSTRACT

Non-volatile and oxide residues that form during semiconductor processing are removed from the semiconductor structure in a two-stage process. An inert gas and a reducing gas are introduced to the reactor. In the first stage, the non-volatile contaminants are sputtered from the semiconductor structure by creating a plasma to ionize the inert gas. The power applied to the plasma is preferably high enough to give the ions of the inert gas a high degree of directionality as they approach the structure. The first stage is continued until the non-volatile contaminants have been sufficiently removed from the structure. In the second stage, the power is reduced and the reducing gas (e.g., hydrogen) reacts with the oxides (e.g., copper oxide) to form elemental metal and water vapor. During the second stage there is no appreciable sputtering, and therefore the damage to the structure is limited as compared with processes that use sputtering and reduction simultaneously.

12 Claims, 4 Drawing Sheets

METHOD OF CLEANSING VIAS IN SEMICONDUCTOR WAFER HAVING METAL CONDUCTIVE LAYER

FIELD OF THE INVENTION

The invention relates to semiconductor processing and in particular to cleaning of an inprocess semiconductor wafer to remove contaminants that could impair the operation of the semiconductor device.

BACKGROUND OF THE INVENTION

The fabrication of an integrated circuit chip normally includes the deposition of metal and dielectric layers over the surface of the semiconductor substrate. The metal layers are separated by the dielectric layers and are patterned to form the desired circuit paths in the device. Interconnections between the metal layers are formed by creating vertical openings, or "vias", which are then filled with metal, through the dielectric layers.

Patterning of the dielectric and metal layers can be accomplished using photoresist. A layer of photoresist is deposited on the underlying layer, and the photoresist is exposed to light in the desired pattern and developed to form a mask which is used to transfer the pattern to an underlying metal or dielectric layer. The transfer process generally involves a reactive plasma treatment in which reactive gas species and directional ion bombardment are used to etch the desired pattern into the metal or dielectric.

These processes typically leave residues of various materials, for example, photoresist, which must be removed to preserve the integrity of the finished device. In addition, the metal layers can become oxidized, and the resulting oxide layers must be removed to assure good ohmic contacts between the different metal layers. The contaminants must be removed, in particular from the vias, and, generally speaking, the contaminants are more difficult to remove as the aspect ratio of the via (i.e., the ratio of its depth to its width) increases. On the other hand, the removal of these contaminants should be carried out in a way that does not significantly alter the structure of the alternating metal and dielectric layers.

One cleaning process is suggested in U.S. Pat. No. 5,660,682 to Zhao et al. The process is described as follows:

The integrated circuit is placed within a reaction chamber, and a flow of argon and a flow of hydrogen are introduced into the reaction chamber, where the flow of hydrogen is greater than the flow of argon. The flows of argon and hydrogen are energized to form a plasma, and the integrated circuit is kept within the plasma, thereby converting the material to gaseous byproducts, for a length of time sufficient to remove at least some of the material from the integrated circuit. (Col. 2, lines 31–39)

The plasma ionizes the argon and hydrogen atoms and reates active excited H*, $H_2$* species. The argon ions physically bombard contaminants such as polymers and oxides, dislodging them, but in vias with high aspect ratios the polymers and oxides may redeposit of the walls of the vias. For this reason, the argon ions are "supplemented" with the hydrogen ions and active H* species. The reaction between the hydrogen ions, the H* species and the polymers produces water vapor and hydrocarbon gas, and the reaction between the hydrogen ions, the H* species and the oxide produces gaseous $SiH_x$. These gases do not redeposit on the sidewalls of the vias and can be removed from the chamber by pumping. (Col. 3, line 65, to col. 4, line 6) The physical and chemical processes take place simultaneously.

There are several possible problems with the process taught in the Zhao et al. patent. First, the physical action of the argon ions not only removes contaminants but also tends to create faceting at the upper corners of the vias, as shown in FIG. 1. This may limit the minimum separation between lines. Second, where the via is formed over a copper layer, the physical action of the argon ions may cause a significant amount of copper, copper oxide and other contaminants to be sputter deposited on the sidewalls of the vias. The copper may then diffuse into the dielectric layer and become mobile under the influence of electric fields or may diffuse during thermal processing. This can cause line-to-line leakage currents to flow through dielectric layer during the operation of the device. Third, contamination on the sidewalls of the vias may adversely affect the wetting properties of the dielectric, causing problems in later processing. In particular, barrier and seed layers deposited on the dielectric may not adhere properly, and voids may be formed when the via is filled with metal by a process such as electrochemical deposition. Such voids increase the resistance of the metal "posts" extending through the vias and connecting the overlying and underlying metal layers and raise concerns about device reliability.

Accordingly, there is a need for a process for cleaning a semiconductor structure which avoids the possible problems of the technique described in the Zhao et al. patent.

SUMMARY OF THE INVENTION

In accordance with this invention, a semiconductor structure is cleaned in multi-stage (i.e., at least a two-stage) process. In a first stage, a plasma is formed adjacent to the structure, the plasma including an inert gas. Power is applied to the plasma at a higher level, the higher level being set such that ions of the inert gas collide with the semiconductor structure and thereby cause atoms of a contaminant to be dislodged from the structure. A reducing gas is introduced to the inert gas plasma. In the following stage, the power applied to the plasma is decreased to a lower level such that the ions of the inert gas generally do not have sufficient energy to cause atoms of the contaminant to be dislodged from the structure; and the reducing gas is allowed to react with the metallic oxide in the semiconductor structure. The power can be decreased from the higher level to the lower level gradually or in one or more steps, or in a combination of ramps and steps.

In some embodiments the inert gas comprises argon and the reducing gas comprises hydrogen. The contaminant may include a hydrocarbon a fluorocarbon, or both.

The process can be used with a variety of metals but is particularly useful when the structure comprises a copper conductor, in which case the reducing gas reacts with the oxides of copper to form pure copper. The process is also particularly suited to structures which contain a via in the dielectric layer.

Decreasing the power from the higher level to the lower level essentially terminates the physical sputtering process when the nonvolatile contaminants (e.g., hydrocarbons and fluorocarbons) have been removed and before the sputtering has created facets on the upper corners of the via. Also, the physical sputtering is terminated before appreciable amounts of copper have been deposited on the sidewalls of the via.

Thus the multi-stage process of this invention avoids many of the problems of the prior art, including the Zhao et al. patent.

DESCRIPTION OF THE INVENTION

The term "semiconductor structure" is used herein to describe a semiconductor wafer or die that needs to be cleaned in the course of processing to form a semiconductor device in the wafer or die. Typically, the structure includes one or more metal layers alternating with one or more dielectric layers above the surface of the semiconductor substrate and a via through at least one of the dielectric layers (sometimes referred to as a "damascene" structure), but this need not be the case. For example, the process can be used on planar films. Typically the metal is copper or a copper alloy, but the process of this invention can be used with other metals and alloys.

During the processing of a semiconductor structure, various types of contaminants can form. For example, when a layer of photoresist is removed after a patterning step, a residue of the photoresist may remain on the structure. Photoresist is typically a polymeric hydrocarbon. Some of the residues can be classified as non-volatile because they do not readily combine with other compounds to form gases. Other residues, such as metal oxides, can normally be reduced or volatilized by causing them to react with hydrogen to form water vapor. To fabricate an electronic device with superior operability it is desirable to remove all of these contaminants and residues, known and unknown, at one or more points in the process.

Figure 5:
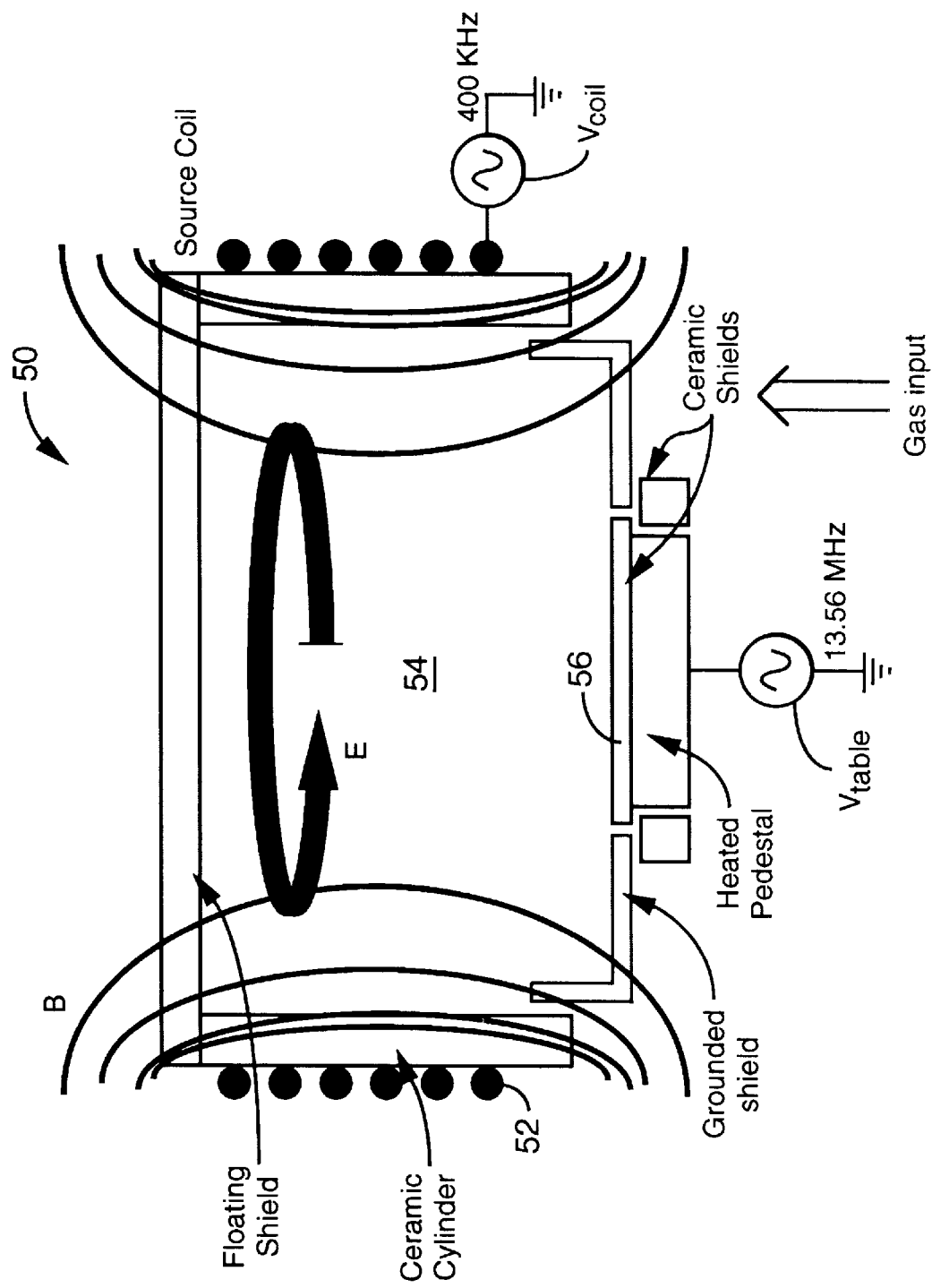
FIG. 5 illustrates a reactor in which the process can be performed.

To perform the process, the semiconductor structure is placed in a reactor such as the Speed® or DamaClean reactors, available from Novellus Systems, Inc., of San Jose, Calif. An illustrative view of such a reactor is shown in FIG. 5. Most of the important components of reactor 50 are labeled and will be known to persons of skill in the art. A coil voltage $V_{coil}$ is applied to a source coil 52, in this case at a frequency of 400 KHz, to create a plasma in a reaction chamber 54. Shown are magnetic lines of force B from source coil 52 which create an electric field E inside chamber 54. A semiconductor wafer or other substrate (not shown) is placed on a heated pedestal 56. A table voltage $V_{table}$ is applied to pedestal 56, in this case at a frequency of 13.56 MHz. A reactive gas or gases are introduced from a region below the pedestal 56.

As indicated above, the process of this invention is a multi-stage process. In the first stage, argon is introduced into the reactor and a plasma is formed. To do this, radio frequency (RF) power may be applied to the source coil at a frequency of 400 kHz and a level of more than 500 W, preferably about 700 W. In addition, power is applied to the wafer pedestal such that the argon ions, formed by the plasma, bombard the wafer with an energy in the range of about 30–1000 eV. For example, RF power may be applied to the pedestal at a frequency of 13.56 MHz and a level of more than 10 W, preferably 400 W. This relatively high energy level provides a high degree of directionality, as a result of the high negative bias on the wafer, that is needed to clean non-volatile contaminants from high aspect ratio vias. The argon gas is introduced at a flow rate of from 5 to 200 sccm, preferably 20 sccm. The pressure in the reactor can be set in a regime less than 10 Torr, preferably in the range between 0.1 Torr and 0.0001 Torr.

In general, any inert gas, such as argon, helium or xenon, can be used to sputter the nonvolatile contaminants so long as the ions of the gas are given a high enough energy to provide an acceptable sputter yield for the contaminant being removed. An energy in the range of 20 eV to 500 eV is typical. The sputter erosion produced in the first stage acts as a "universal solvent". It is capable of etching away contaminants whose thickness and chemical makeup are highly variable and often unknown because of their dependence on prior process steps (e.g., thermal or plasma treatments). Examples of contaminants that can be removed in the first stage are fluorocarbons and polymeric hydrocarbons, such as photoresist. The sputtering can also remove oxides.

Figure 2A:
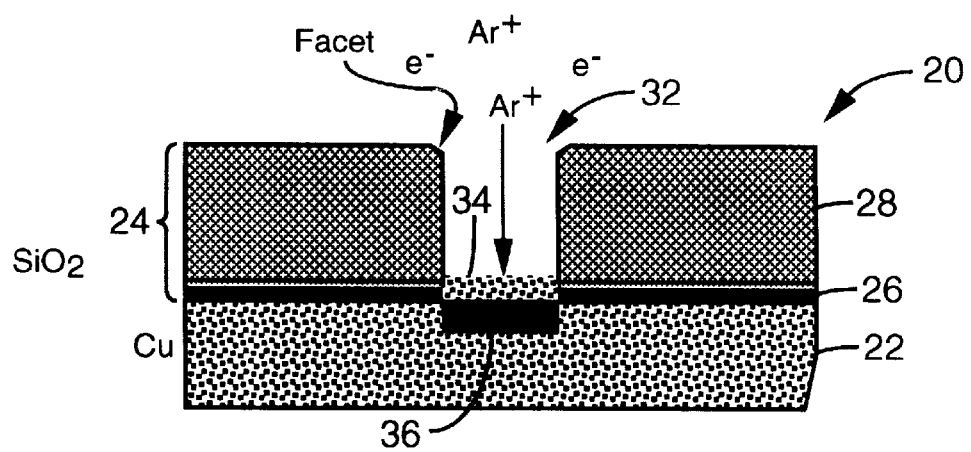
FIG. 2A illustrates the first stage of the process of this invention.

The first stage is illustrated in FIG. 2A, which shows a semiconductor structure 20 containing a copper conductive layer 22, and a multilayer dielectric 24 which includes a SiN layer 26 and a $SiO_2$ layer 28. A via 32 extends through multilayer dielectric 24. The numeral 34 identifies a residue from prior processing at the bottom of via 32, and the numeral 36 a layer of copper oxide ($CuO_2$ and/or CuO). As shown, the positively charged argon ions are directed downward at residue 34 with a high degree of directionality and dislodge atoms or molecules of residue 34.

Figure 3A:
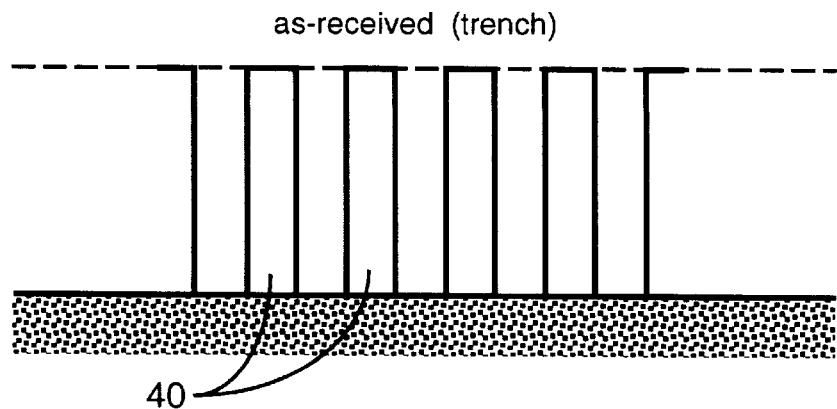
FIGS. 3A–3C illustrate how faceting can limit the minimum line separation.
Figure 3B:
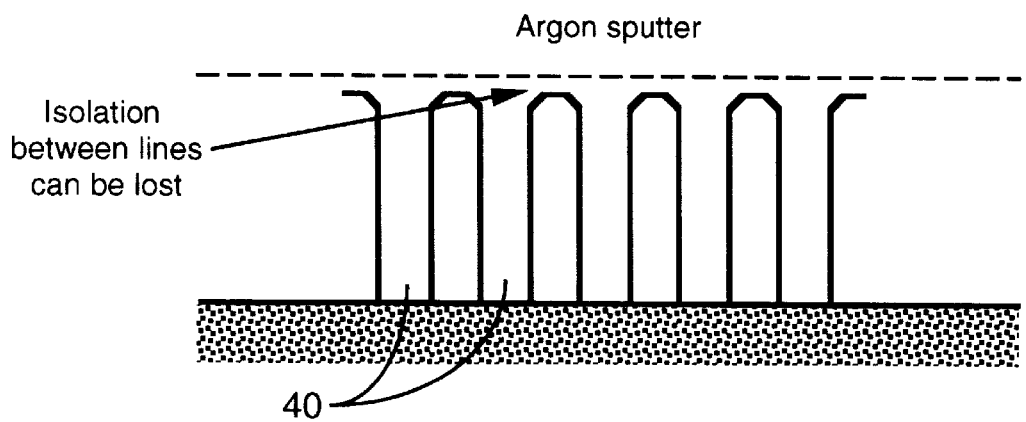
Figure 3C:
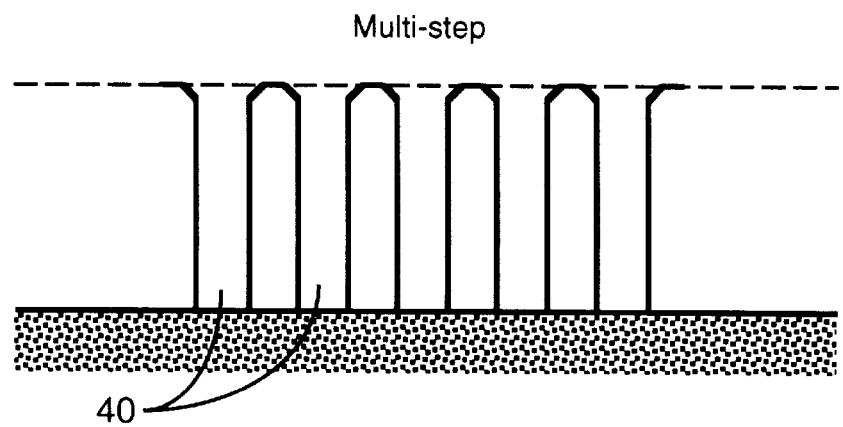

The first stage of the process typically continues for about 4 to 10 seconds. This time is much less than is necessary when the sputtering and chemical reduction are performed in a single step, as described in Zhao et al. patent, and therefore the amount of faceting that occurs at the upper corners of via 32 is minimal. This allows the distances between vias and trenches to be less than is possible when there is a significant amount of faceting. FIGS. 3A–3C show how the isolation between lines can be lost by faceting. FIG. 3A shows the original shape of trenches that contain lines 40. FIG. 3B shows how the separation between lines 40 can be lost by faceting at the upper comers of the trenches. FIG. 3C shows how the use of this invention to limit the amount of faceting can preserve the separation between lines 40. As indicated in FIGS. 3A–3C, the spacing between the trenches can be on the same order of magnitude as the width of the trenches.

After the first stage has been performed for the appropriate time, the power applied to the wafer pedestal ($V_{table}$) is decreased and a reducing gas such as hydrogen is introduced into the reactor. Alternatively, other reducing gases such as ammonia ($NH_3$) or methanol (methyl alcohol) vapor can be used instead of hydrogen. In the following stage the power is set at or below a level at which the gas ions do not have sufficient kinetic energy to produce a significant amount of sputtering. This energy is about 25 eV. The power provided to the wafer pedestal may, in fact, be reduced to zero, and the plasma itself may be relied upon to induce a sufficient negative bias on the wafer (sometimes referred to as "self-biasing"). The ions acquire a kinetic energy of about 25 eV by passing through the sheath of the plasma. Enough power must be applied to the coil of the reactor to maintain the plasma.

Since copper, copper oxide, silicon dioxide and many other materials commonly encountered in semiconductor processing have sputter thresholds of 20–30 eV, maintaining the energy of the ions at or below about 25 eV assures that significant sputtering does not occur. Instead, the salient feature of the following stage is the chemical reduction of copper oxide to form elemental copper from cupric or cuprous oxide according to one or both of the following reactions:

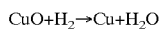

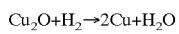

The copper oxide may be found either in a thin layer of "native copper oxide" (1–2 nm thick) that forms whenever copper is exposed to air, or in a thicker layer (2–10 nm thick) that forms when copper is exposed to oxidizing thermal or plasma environments during semiconductor processing. In either case, the reduction reaction is allowed to continue until substantially all of the copper oxide has been reduced. It will be apparent that during the second stage, since the predominant mechanism is chemical rather than physical, there is no significant amount of faceting at the upper corners of the via.

Figure 2B:
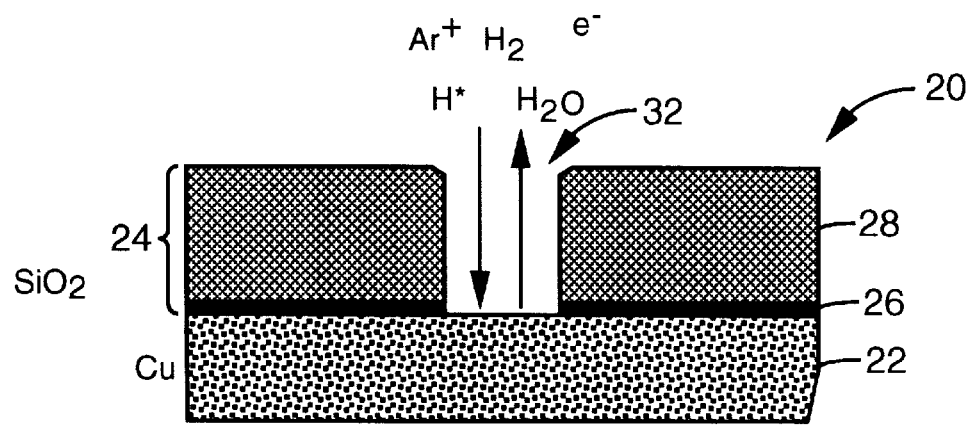
FIG. 2B illustrates the second stage of the process of this invention.

The second stage is illustrated in FIG. 2B, which shows hydrogen atoms being directed against the structure and reacting with the copper oxide to form water vapor. In the drawing, H* represents the excited species of the hydrogen atom.

The gas flows do not need to be changed during the first and second stages. In one embodiment, the reducing gas is also present during the first stage, and thus reduction occurs simultaneously with the sputtering. In the second stage, however, the role of the inert gas is primarily to sustain or stabilize the plasma.

Figure 4:
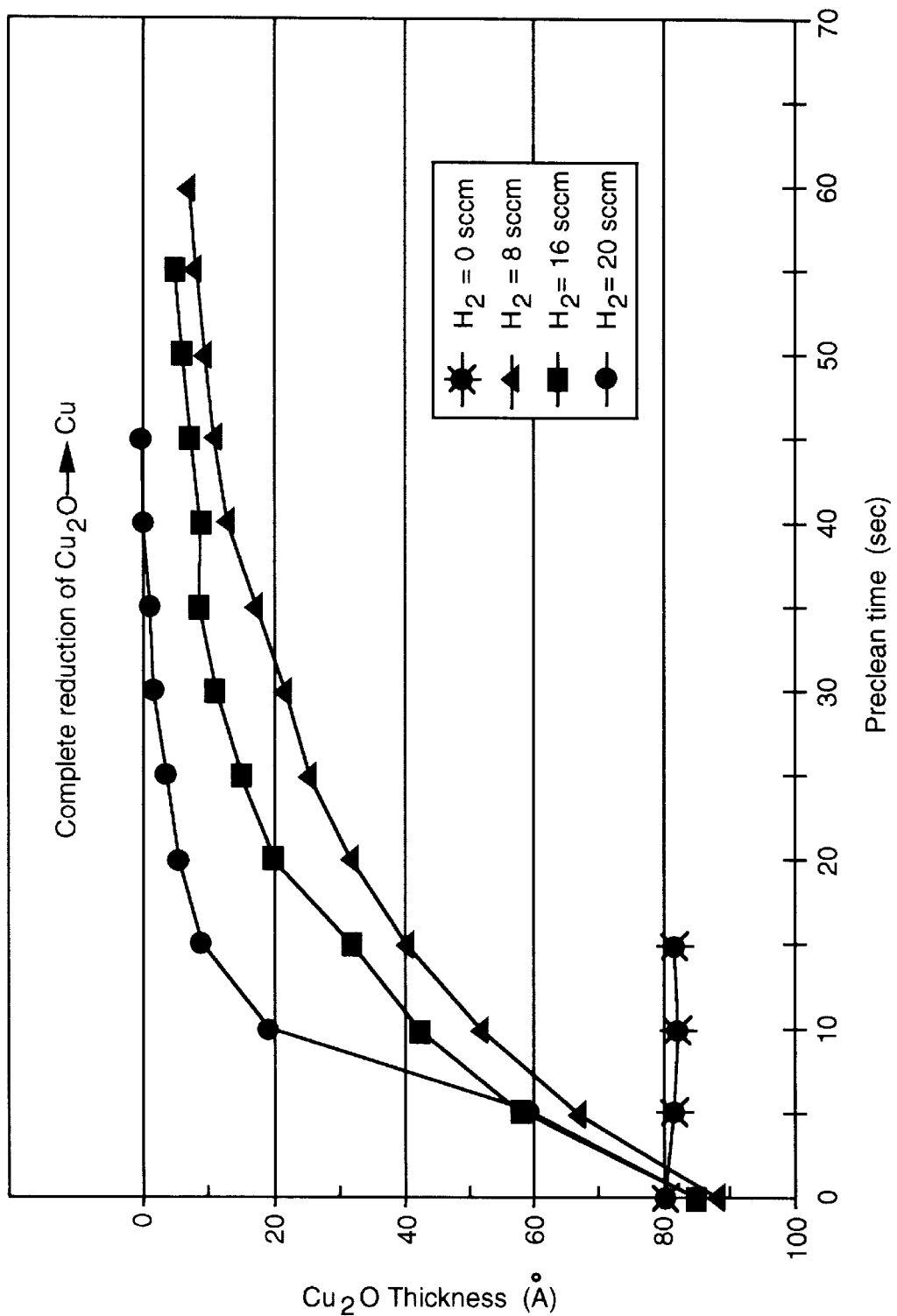
FIG. 4 is a graph showing the effect of adding $H_2$ to an argon plasma when the table voltage is equal to zero.

FIG. 4 shows the effect on copper oxide removal of adding hydrogen to an argon plasma after the power delivered to the wafer pedestal has been reduced to zero (the "self-biasing" arrangement described above). The power supplied to the source coil was 750 W, the termperature of the reactor was set to 20° C., and the flow rate of argon was 10 sccm. As indicated, when the flow rate of hydrogen was zero, there was no removal (sputtering) of the copper oxide. As the flow rate of hydrogen was increased from zero to 20 sccm, the copper oxide was reduced (not sputtered) at an increasing rate. FIG. 4 thus indicates clearly that in the following stage of the process, there is no sputtering, and reduction is responsible for the removal of the copper oxide residue.

Figure 1:
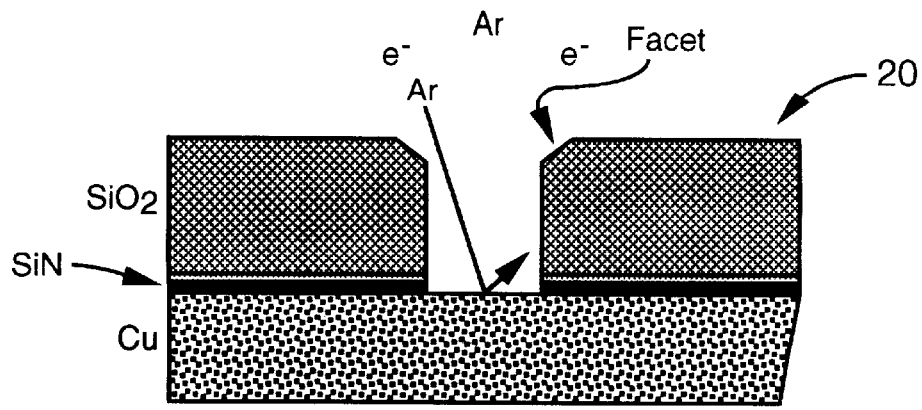
FIG. 1 is a cross-sectional view of a semiconductor structure showing some of the problems with the prior art cleaning techniques.

The multi-stage process of this invention has at least the following advantages over prior art processes such as the one described in the Zhao et al. patent:

1. By shortening the sputtering time to that required to remove the non-volatile contaminants, undue damage to the structure (such as faceting at the upper corners of the via, as shown in FIG. 1) is minimized.

2. A certain amount of copper and copper oxide is sputtered along with the non-volatile contaminants and some of this is deposited on the sidewalls of the via. The copper, in particular, may diffuse into the interlayer dielectric (silicon dioxide layer 28) and become mobile as a result of an electric field or thermal processing. Shortening the sputter time, reduces the amount of copper deposited on the sidewalls of the via.

3. Contamination on the sidewalls of the via adversely affects the wetting properties of the interlayer dielectric. This in turn may cause voids to form when the via is filled with metal. Such voids increase the resistance of the metal in the via. Again, reducing the sputtering time minimizes the amount of contamination that deposits on the sidewalls of the via.

In some cases it may be desirable to reverse the stages, with the chemical reduction of the metal oxides being carried out before the sputtering of the non-volatile contaminants. The table power ($V_{table}$) is set at a low level during the first stage and is increased in one or more steps or gradually to a higher level in the following stage. The flow of $H_2$ may be cut off in latter stage, leaving a pure argon plasma.

It will be understood that the embodiments described above are illustrative only, and not limiting. Numerous alternative embodiments will be obvious to persons skilled in the art.

We claim:

1. A process for cleaning a semiconductor structure comprising:

introducing an inert gas to a region adjacent to the structure;

forming a plasma so as to ionize the inert gas;

applying power to the plasma at a higher level, the higher level being set such that ions of the inert gas collide with the semiconductor structure and thereby cause atoms of a contaminant to be dislodged from a surface of the structure;

introducing a reducing gas to the plasma;

reducing the power applied to the plasma to a lower level such that the ions of the inert gas generally do not have sufficient energy to cause atoms of the contaminant to be dislodged from the structure; and allowing the reducing gas to react with an oxide in the semiconductor structure.

2. The process of claim 1 wherein the inert gas comprises argon.

3. The process of claim 1 wherein the reducing gas comprises pure hydrogen.

4. The process of claim 1 wherein the reducing gas comprises a gas selected from the group consisting of $NH_3$, $H_2O$, methyl alcohol and other hydrogen containing compounds.

5. The process of claim 1 wherein the contaminant comprises at least one material from the group consisting of hydrocarbons and fluorocarbons.

6. The process of claim 5 wherein the contaminant comprises photoresist.

7. The process of claim 1 wherein the structure comprises a layer of copper.

8. The process of claim 1 wherein the structure comprises a layer of a material selected from the group consisting of CuMg, CuAl and other copper alloys.

9. The process of claim 1 wherein the reducing gas reacts with an oxide of copper.

10. The process of claim 1 wherein the structure comprises a dielectric layer formed over the layer of copper.

11. The process of claim 1 wherein a via is formed in the dielectric layer.

12. A process for cleaning a semiconductor structure comprising:

introducing an inert gas and a reducing gas to a region adjacent to the structure;

forming a plasma in the region, power being applied to the plasma at a lower level such that the ions of the inert gas generally do not have sufficient energy to cause atoms of a contaminant to be dislodged from the structure;

allowing the reducing gas to react with a metallic oxide in the semiconductor structure; and increasing the power applied to the plasma to a higher level, the higher level being set such that ions of the inert gas collide with the semiconductor structure and thereby cause atoms of the contaminant to be dislodged from the structure.

* * * * *